United States Patent [19]

Havemann et al.

[11] Patent Number: 5,668,398
[45] Date of Patent: Sep. 16, 1997

[54] MULTILEVEL INTERCONNECT STRUCTURE WITH AIR GAPS FORMED BETWEEN METAL LEADS

[75] Inventors: Robert H. Havemann, Garland; Shin-puu Jeng, Plano, both of Tex.

[73] Assignee: Texas Instruments Incorporated, Dallas, Tex.

[21] Appl. No.: 631,437

[22] Filed: Apr. 12, 1996

Related U.S. Application Data

[60] Continuation of Ser. No. 428,814, Apr. 24, 1995, abandoned, which is a division of Ser. No. 250,063, May 27, 1994, Pat. No. 5,461,003.

[51] Int. Cl.⁶ .................................................. H01L 29/40
[52] U.S. Cl. .......................... 257/522; 257/508; 257/632; 257/773
[58] Field of Search .................................. 257/522, 758, 257/773, 787, 788, 508, 760, 776, 632

[56] References Cited

U.S. PATENT DOCUMENTS

| | | | |
|---|---|---|---|
| 4,652,467 | 3/1987 | Brinker et al. | 427/246 |
| 4,797,294 | 1/1989 | Berg | 426/330.4 |
| 4,987,101 | 1/1991 | Kaanta et al. | 437/228 |
| 5,103,288 | 4/1992 | Sakamoto et al. | 257/632 |
| 5,119,164 | 6/1992 | Sliwa, Jr. et al. | 257/776 |
| 5,266,126 | 11/1993 | Deguchi | 136/256 |
| 5,276,414 | 1/1994 | Fujimoto et al. | 257/788 |
| 5,310,700 | 5/1994 | Lien et al. | 257/760 |
| 5,324,683 | 6/1994 | Fitch et al. | 437/65 |
| 5,407,860 | 4/1995 | Stoltz et al. | 437/180 |
| 5,470,802 | 11/1995 | Gnade et al. | 437/238 |
| 5,472,913 | 12/1995 | Havemann et al. | 437/195 |
| 5,486,493 | 1/1996 | Jeng | 437/195 |
| 5,488,015 | 1/1996 | Havemann et al. | 437/195 |
| 5,494,858 | 2/1996 | Gnade et al. | 437/231 |
| 5,523,615 | 6/1996 | Cho et al. | 257/632 |
| 5,561,318 | 10/1996 | Gnade et al. | 257/638 |

FOREIGN PATENT DOCUMENTS

| | | | |
|---|---|---|---|
| 0 501 407 A1 | 2/1992 | European Pat. Off. | |
| 0 537 001 A1 | 4/1993 | European Pat. Off. | |
| 0005643 | 1/1987 | Japan | 257/760 |
| 0179548 | 7/1988 | Japan | 257/760 |
| 0021617 | 1/1993 | Japan | 437/195 |

*Primary Examiner*—Tom Thomas
*Assistant Examiner*—David B. Hardy
*Attorney, Agent, or Firm*—Kay Houston; W. James Brady, III; Richard L. Donaldson

[57] ABSTRACT

A semiconductor device with air gaps 22 between metal leads 16, comprising metal leads 16 formed on a substrate 12, air gaps 22 between metal leads 16, a 10–50% porous dielectric layer 20 on the metal leads 16 and over the air gaps 22, and a non-porous dielectric layer 24 on the porous dielectric layer 20. Optional features include a patterned oxide 28 over the metal leads 16 and a passivation layer 26 over the metal leads 16 and patterned oxide 28. The porous dielectric layer 20 may comprise an aerogel or xerogel.

8 Claims, 4 Drawing Sheets

MULTILEVEL INTERCONNECT STRUCTURE WITH AIR GAPS FORMED BETWEEN METAL LEADS

This application is a Continuation of application Ser. No. 08/428,814, filed Apr. 24, 1995, now abandoned, which is a division of application Ser. No. 08/250,063, filed May 27, 1994, now U.S. Pat. No. 5,461,003.

CROSS-REFERENCE TO RELATED APPLICATIONS

The following co-assigned U.S. patent applications are hereby incorporated herein by reference:

| TI Case | Ser. No | Filing Date | Inventor | Title |
| --- | --- | --- | --- | --- |
| TI-18509 | 08/137,658 | 10/15/93 | Jeng | Planarized Structure for Line-to-Line Capacitance Reduction |
| TI-18867 | 08/201,679 | 2/25/94 | Jeng et al | Selective Filling Narrow Gaps with Low-dielectric-constant materials |
| TI-18929 | 08/202,057 | 2/25/94 | Jeng | Planarized Multilevel Interconnect Scheme with Embedded Low-Dielectric-Constant Insulators |
| TI-19068 | 08/234,443 | 4/28/94 | Cho | Low Dielectric Constant Insulation in VLSI applications |
| TI-19071 | 08/234,099 | 4/27/94 | Havemann | Via Formation in Polymeric Materials |
| TI-18941 | 08/247,195 | 5/20/94 | Gnade et al | A Low Dielectric Constant Material for Electronics Applications |
| TI-19072 | 08/246,432 | 5/20/94 | Havemann et al | Interconnect Structure with an Integrated Low Density Dielectric |

The following U.S. patent applications filed on May 27, 1994 concurrently herewith the patent application for the present invention, are also incorporated herein by reference:

| TI Case | Ser. No. | Inventor | Title |
| --- | --- | --- | --- |
| TI-19073 | 08/250,192 | Tigelaar et al | Suppression of Interlead Leakage when using Airgap dielectric |
| TI-19154 | 08/250,062 | Tsu | Reliability Enhancement of Aluminum interconnects by Reacting Aluminum Leads with a Strengthening Gas |
| TI-19253 | 08/250,142 | Havemann | Two-step Metal Etch Process for Selective Gap Fill of Submicron Interconnects and Structure for Same |
| TI-19179 | 08/250,747 | Gnade et al | Low Dielectric Constant Layers via Immiscible Solgel Processing |

FIELD OF THE INVENTION

This invention relates generally to the fabrication of semiconductor devices, and more specifically to using air gaps as a low-dielectric constant material between metal leads.

BACKGROUND OF THE INVENTION

Semiconductors are widely used in integrated circuits for electronic applications, including radios and televisions. Such integrated circuits typically use multiple transistors fabricated in single crystal silicon. Many integrated circuits now contain multiple levels of metallization for interconnections. The need to integrate more functions onto a chip has caused the semiconductor industry to search for ways to shrink, or scale, the size of individual transistors and other devices commonly integrated on a chip. However, scaling devices to smaller dimensions can create a multitude of undesirable effects. One of these effects is an increase in the capacitive coupling between conductors in a circuit. Therefore, it becomes imperative to reduce the RC time constant within today's multi-level metallization systems.

The capacitance between conductors is highly dependent on the insulator, or dielectric, used to separate them. Conventional semiconductor fabrication commonly employs silicon dioxide as a dielectric, which has a dielectric constant of about 3.9. The lowest possible, or ideal, dielectric constant is 1.0, which is the dielectric constant of a vacuum, whereas air has a dielectric constant of less than 1.001.

SUMMARY OF THE INVENTION

A semiconductor device and method is disclosed herein that forms air gaps between metal leads to provide a composite low-dielectric constant of, e.g., about 1.25 between leads which will substantially reduce the capacitive coupling between conductors in a circuit.

The present invention includes a method for forming air gaps between metal leads of a semiconductor device and semiconductor device structure for same. A metal layer is deposited on a substrate. The metal layer is etched to form metal leads. A disposable solid layer is deposited between the metal leads. A porous dielectric layer is deposited over the disposable solid layer and the metal leads. The disposable solid layer is removed through the porous dielectric layer to form air gaps between the metal leads beneath the porous dielectric layer.

In another preferred embodiment, a metal layer is deposited on a substrate, and a first oxide layer is deposited on the metal layer. The first oxide layer and the metal layer are etched to form etched oxide and metal leads, leaving portions of the substrate exposed. A disposable solid layer is deposited on the etched oxide, metal leads and exposed portions of the substrate. A top portion of the disposable solid layer is removed to lower the disposable solid layer from at least the tops of the etched oxide. A porous dielectric layer is deposited on the disposable solid layer and at least the tops of the etched oxide. The disposable solid layer is removed through the porous dielectric layer to form air gaps between the metal leads and portions of the etched oxide beneath the porous dielectric layer.

An advantage of the invention includes a novel method of forming air gaps between metal leads. The air gaps have a low-dielectric constant and result in reduced sidewall capacitance of the metal leads.

A further advantage of another preferred embodiment is increasing the process margin by having a relatively thick second oxide layer on top of the metal leads, which allows for a thicker formation of the disposable solid layer. Also, an air gap may be formed near the tops and top corners of the metal leads, to reduce fringing capacitance between leads.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including schematic representations and manufacturing methods. Corresponding numerals and symbols in the different figures refer to corresponding parts unless otherwise indicated. Table 1 below provides an overview of the elements of the embodiments and the drawings.

TABLE 1

| Drawing Element | Preferred or Specific Examples | Generic Term | Other Alternate Examples or Descriptions |
|---|---|---|---|
| 10 | Semiconductor wafer | Semiconductor device | Hybrid semiconductor |
| 12 | Silicon | Substrate | May be other metal interconnect layers or semiconductor elements, (e.g. transistors, diodes); Compound semiconductors (e.g. GaAs, InP, Si/Ge, SiC); insulators, ceramics, etc . . . |
| 14 | $SiO_2$ | First oxide layer | TEOS (Tetraethoxysilane), PETEOS (Plasma-enhanced TEOS), BPSG (boron phosphate silicate glass), other dielectric materials. |
| 16 | Aluminum | Metal leads | Trilayer of TiN/AlCu/TiN; Alloys of Al, Cu, Mo, W, Ti, Si; Polysilicon, silicides, nitrides, carbides; AlCu alloy with Ti or TiN underlayers; Metal interconnect layer. |
| 18 | Photoresist | Disposable Solid Layer | Polymers such as polyimide, parylene or, Teflon; electronresist; solid organics or inorganics; BCB (bisbenzocyclobutene); PMMA (poly-[methyl methacrylate]). |
| 20 | Silicon dioxide-based xerogel | Porous dielectric layer | Aerogels; Spin-on materials with pores large enough for $CO_2$ gas or liquids to move through. |
| 22 | | Air gaps | "Air", as used herein, may include voids, inert gases or vacuum. |
| 24 | PETEOS | Non-porous dielectric layer | SOG, $Si_3N_4$ (silicon nitride) |

TABLE 1-continued

| Drawing Element | Preferred or Specific Examples | Generic Term | Other Alternate Examples or Descriptions |
| --- | --- | --- | --- |
| 26 | | Passivating layer | Oxide or nitride layer (e.g. conformal); $SiO_2$ deposited by plasma at low temperature; SACVD or LPCVD oxide layer, plasma-enhanced nitride layer. |
| 28 | $SiO_2$ | Etched portions of second oxide layer | CVD oxide layer |

Figure 1A:
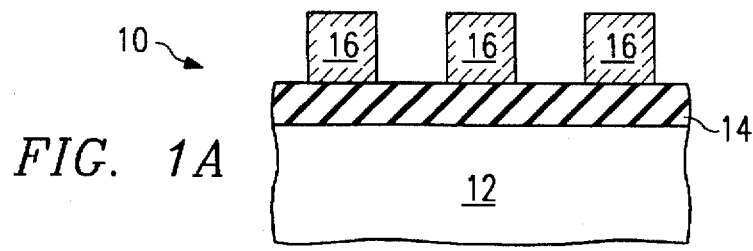
FIGS. 1A–1F, show cross-sections of a portion of a semiconductor device, illustrating several steps in the application of a first embodiment of the invention to a typical device.

FIG. 1A shows a cross-sectional view of a semiconductor wafer upon which a first preferred embodiment of the present invention will be performed. The semiconductor wafer 10 has a substrate 12 which may, for example, contain transistors, diodes, and other semiconductor elements (not shown) as are well known in the art. The substrate 12 may also contain metal interconnect layers. First oxide layer 14 has been deposited over the substrate 12 and comprises TEOS (tetraethosiloxane). First oxide layer 14 could also comprise PETEOS (plasma-enhanced tetraethosiloxane), BPSG (boron phosphate silicate glass) or other dielectric materials. A metal interconnect layer has been deposited over first oxide layer 14. The metal interconnect layer preferably comprises aluminum, but may, for example, comprise a titanium-tungsten/aluminum bilayer or other metal. The metal interconnect layer has been etched in a predetermined pattern to form etch lines, or metal leads 16.

Figure 1B:
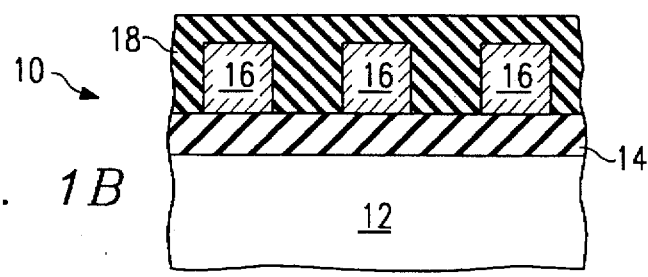
Figure 1C:
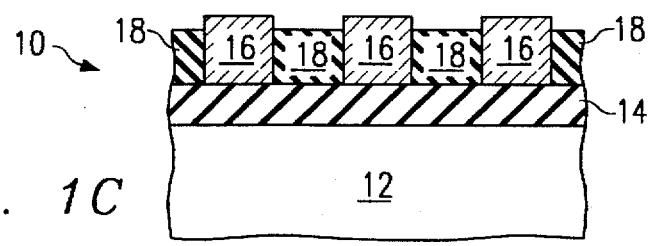
Figure 1D:
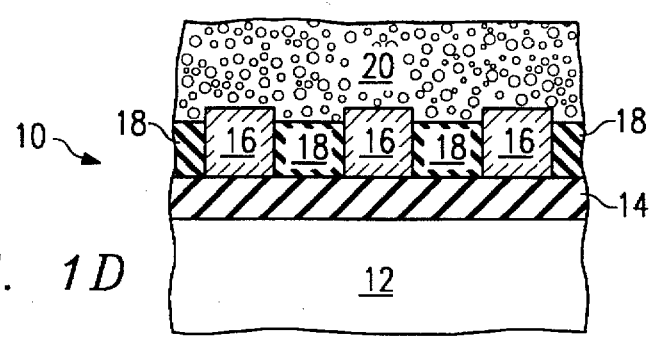

FIG. 1B shows the wafer 10 after a disposable solid layer 18 has been deposited over metal leads 16 and first oxide layer 14. Disposable solid layer 18 is generally a polymer, preferably photoresist, but could also be other polymers such as polyimide, parylene, Teflon, or BCB. The top of disposable solid layer is then removed (e.g. etched back) to expose at least the tops of the metal leads 16, as shown in FIG. 1C. Porous dielectric layer 20 is deposited on disposable solid layer 18 and at least tops of metal leads 16, as shown in FIG. 1D. Porous dielectric layer 20 is preferably comprised of a silica-based xerogel with a 10–50% porosity, although other materials with pores large enough for the molecules of the disposable solid layer 18 to move through may also be used. It is also preferable for the material used in disposable solid layer 18 to decompose in oxygen (this can be e.g. air or some other oxygen-containing atmosphere, or including an oxygen plasma or ozone).

Figure 1E:
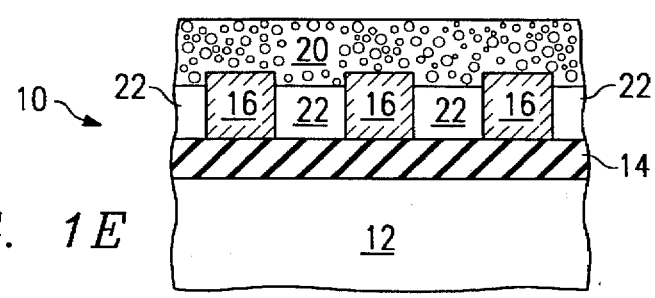
Figure 1F:
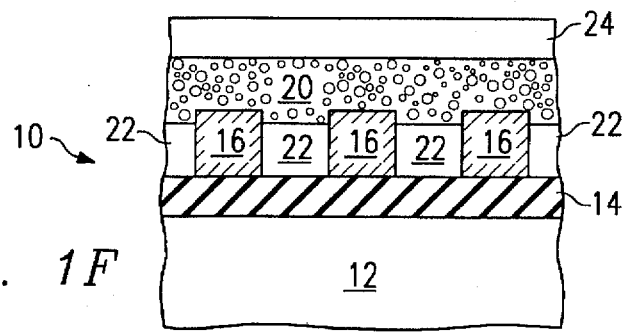

The porous dielectric layer 20 may be planarized. Then the disposable solid layer 18 is removed through the porous dielectric layer 20 to form air gaps 22 as shown in FIG. 1E. The removal of the disposable solid layer 18 is preferably accomplished by exposing the wafer to oxygen or oxygen-plasma at a high temperature (typically >100° C.), to vaporize, or burn off the photoresist. The oxygen moves through the porous dielectric layer 20 to reach the disposable solid layer 18 and react with solid layer 18 and convert it to a gas that moves back out of porous dielectric layer 20. In the preferred embodiment, the photoresist reacts with the oxygen to form gaseous byproducts, including either $CO_2$ or CO. The photoresist vaporizes (the reaction products of the solid form a gas). The high temperature speeds up the reaction; and the presence of oxygen lowers the reaction temperature. If a pure polymer is used, all of the disposable solid layer 18 will be removed, leaving only air gaps 22. The "air" gaps may also be comprised of inert gases or a vacuum. The air gaps 22 provide an excellent low-dielectric constant material, with a composite dielectric constant of e.g. about 1.25. Finally, non-porous dielectric layer 24 is deposited on top of the porous dielectric layer 20 as shown in FIG. 1F. The non-porous dielectric layer is preferably a CVD oxide, which seals the porous dielectric layer 20 from moisture, provides improved structural support and thermal conductivity, and passivates the porous dielectric layer 20. Subsequent processing steps may then performed (not shown), e.g. planarization of non-porous dielectric layer 24, or further deposition and etching of semiconductor, insulative and metallic layers.

Figure 2:
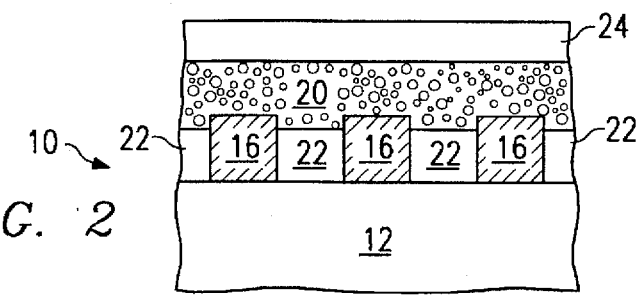
FIG. 2 shows a second embodiment of the invention.
Figure 3:
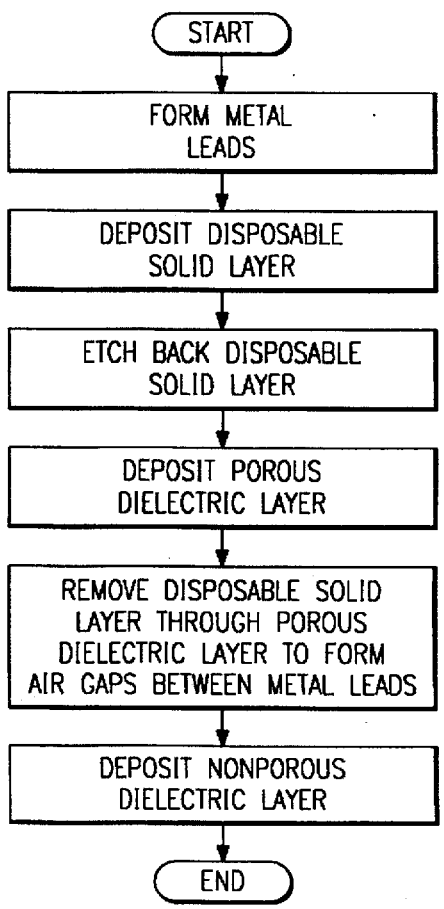
FIG. 3 is a flow chart describing the steps of the invention.

A second embodiment is shown in FIG. 2. The metal leads 16 have been formed directly on the substrate 12, and the subsequent steps of the invention as described for the first embodiment are then performed. In this embodiment, the substrate 12 may comprise an insulator. A flow chart for the first and second embodiments shown in FIGS. 1 and 2 is shown in FIG. 3.

Figure 4A:
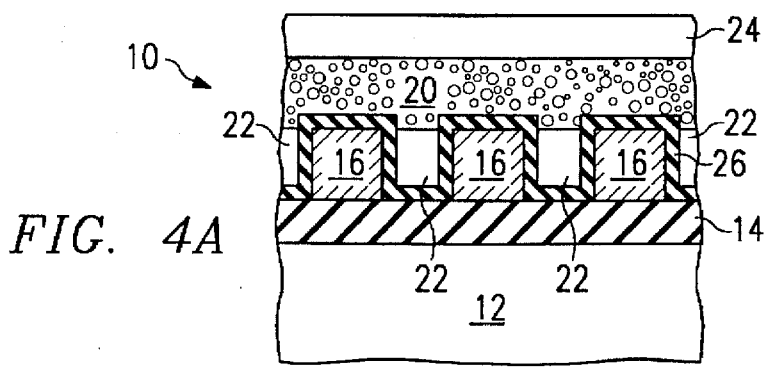
FIGS. 4A and 4B show cross-sections of third and fourth embodiments of the present invention, with the added feature of a passivating layer deposited over the metal leads.

Since an organic polymer is preferably not bound to first oxide layer 14 surface or to portions of the sidewall of metal leads 16, the surfaces will not be passivated and can provide active surfaces which can act as a path for leakage current. FIG. 4A shows a third embodiment of the present invention in which a (for example, conformal) passivating layer 26 passivates both exposed surfaces of first oxide layer 14 and prevents interlead leakage. A fourth embodiment (FIG. 4B) involves exposing the metal leads to a gas to react and form a passivating layer only around metal leads 16.

Figure 5A:
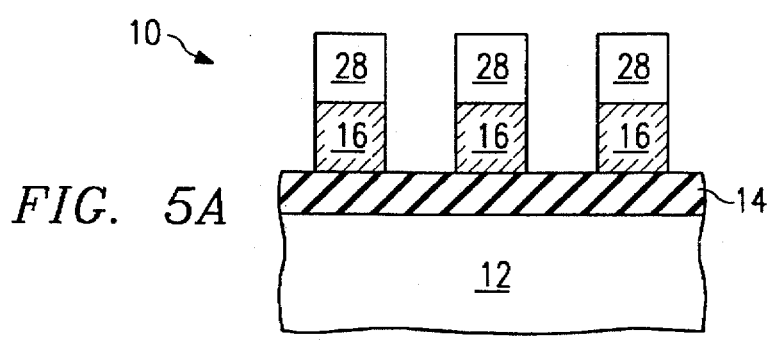
FIGS. 5A–5D show cross-sections of a portion of a semiconductor device, illustrating several steps in the application of a fifth embodiment of the invention to a typical device.

A fifth preferred embodiment of the invention is shown in FIGS. 5A–5D. FIG. 5A shows a cross-sectional view of a semiconductor wafer upon which this embodiment of the present invention will be performed. First oxide layer 14 has been deposited over the substrate 12 of semiconductor wafer 10. A metal interconnect layer has been deposited over first oxide layer 14, and a second oxide layer has been deposited over the metal interconnect layer. The thickness of this second oxide layer is preferably about 50–100% the height of the metal interconnect layer. The second oxide layer and the metal interconnect layer are etched (generally in separate etch steps) in a predetermined pattern to form etch lines, or metal leads 16 with etched portions 28 of second oxide layer remaining on top of metal leads 16.

Figure 5B:
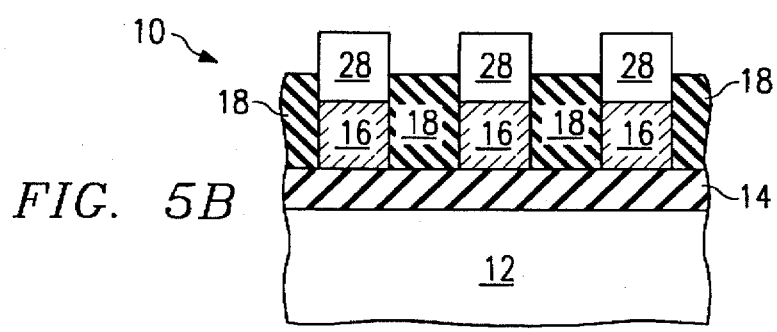
Figure 5C:
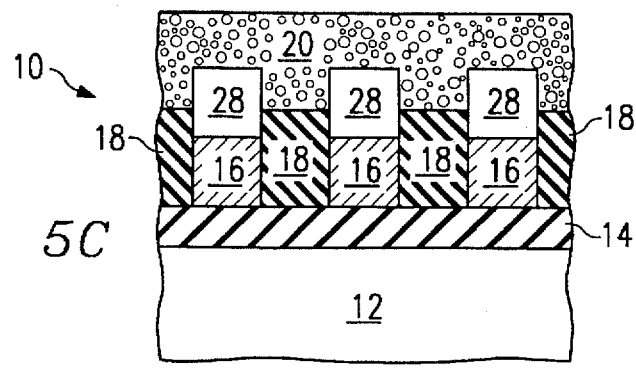
Figure 5D:
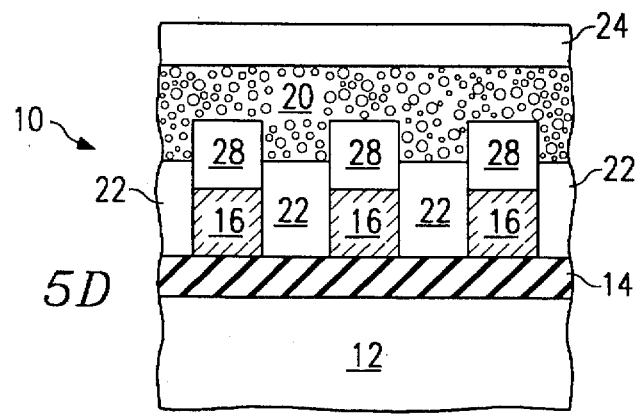

A disposable solid layer 18 is deposited over etched portions 28 of second oxide layer and metal leads 16. The disposable solid layer 18 is then removed (e.g. etched back) to expose at least the tops of the etched portions 28 of second oxide layer, as shown in FIG. 5B. Preferably, 70–90% (but also suitably, 60–100%) of the etched portion 28 of second oxide layer remains covered with disposable solid layer 18 after the etch-back step. Porous dielectric layer 20 is deposited on disposable solid layer 18 and at least tops of etched portion 28 of second oxide layer, as shown in FIG. 5C. The porous dielectric layer 20 may be planarized, and then the disposable solid layer 18 may be removed through the porous dielectric layer 20 (as described in the first embodiment) to form air gaps 22 to leave porous dielectric layer 20 remaining on air gaps 22 and at least etched portions 28 of second oxide layer. Finally, non-porous dielectric layer 24 may be deposited on top of the porous dielectric layer 20 as shown in FIG. 5D. Subsequent processing steps may then be performed (not shown), e.g. planarization of non-porous dielectric layer 24, or further deposition and etching of semiconductor, insulative and metallic layers.

Figure 4B:
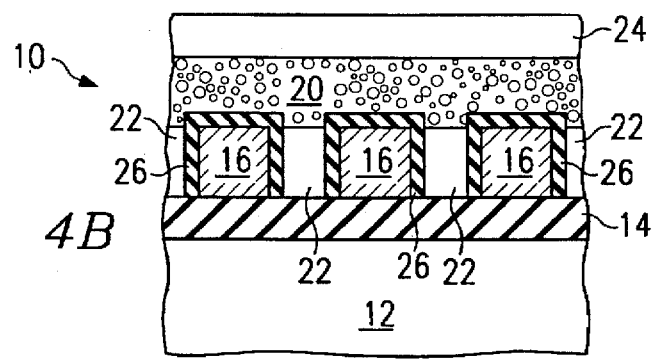
Figure 6A:
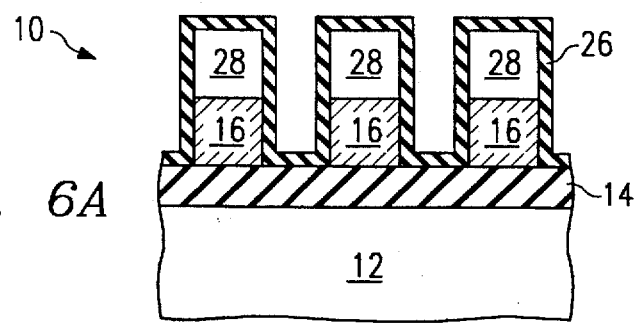
FIGS. 6A and 6B show cross-sections of a sixth embodiment of the present invention, with the added feature of a passivating layer deposited over the metal leads, etched portion of second oxide layer, and first oxide layer.
Figure 6B:
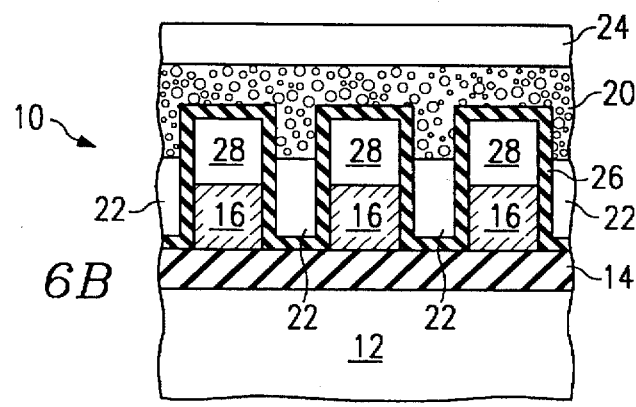

The sixth embodiment includes the fifth embodiment with a passivation layer 26 applied over etched portions 28 of second oxide layer, metal leads 16, and first oxide layer 14 (FIGS. 6A and 6B), as described for the third embodiment (the metal leads 16 may alternately or also be treated as in FIG. 4B).

Another method of removing the disposable solid layer 18 may involve introducing a solvent to the wafer, such as acetone. The wafer can be agitated to facilitate movement of the solvent through the porous dielectric layer 20 to reach the disposable solid layer 18. The solvent dissolves the polymer 18 and then a vacuum may be utilized to remove the gaseous by-products of the dissolved disposable solid layer 18 through the porous dielectric layer 20.

The present invention offers a novel method of forming air gaps between metal leads which is beneficial to semiconductors requiring low-dielectric constant materials. The air gaps have a low-dielectric constant and result in reduced sidewall capacitance of the metal leads. The fifth embodiment described has the further advantage of increasing the process margin by having a second oxide layer on top of the metal leads, which allows for a thicker formation of the disposable solid layer. Also, an air gap may be formed near the tops and top corners of the metal leads, to reduce fringing capacitance from lead to lead.

Generally xerogel-type formation of the porous layer is preferred. In this process, a solution, containing a glass-former such as TEOS, is spun on, gelled (typically by a pH change), aged, and dried to form a dense (10–50% porosity) open-pored, solid. Such processing involves significant permanent shrinkage (densification) during drying. Aerogel-type processing can also be used, which avoids any significant permanent shrinkage and can provide higher porosity (e.g. up to 95% porosity). Although aerogel-type porosity can provide lower interlayer capacitance, the denser layers are better structurally, and are preferred.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. Although not preferred, disposable solid material may be removed by sublimation through the porous layer. It is therefore intended that the appended claims encompass any such modifications or embodiments.

What is claimed is:

1. A semiconductor device with air gaps between metal leads, comprising:

metal leads formed in a pattern on a substrate, said metal leads having a height above said substrate, said metal leads having sides and tops;

air gaps fully extending between said sides of said metal leads, said air gaps having a height above said substrate, wherein said height of said air gaps is at least said height of said metal leads;

a single unpatterned porous dielectric layer residing on said tops of said metal leads and residing over said air gaps, said porous dielectric layer having a porosity of 10–50%; and a non-porous dielectric layer on said porous dielectric layer, further comprising patterned oxide on said tops of said metal leads, said patterned oxide having the same pattern as said metal leads, said patterned oxide having a height of 50–100% said metal lead height.

2. A semiconductor device with air gaps between metal leads, comprising:

metal leads formed in a pattern on a substrate, said metal leads having a height above said substrate, said metal leads having sides and tops;

patterned oxide on said tops of said metal leads, said patterned oxide having the same pattern as said metal leads, said patterned oxide having a height of 50–100% said metal lead height;

air gaps fully extending between said sides of said metal leads, said air gaps having a height above said substrate, wherein said height of said air gaps is at least said height of said metal leads; and a single unpatterned porous dielectric layer residing over at least said patterned oxide and said air gaps, said porous dielectric layer having a porosity of 10–50%.

3. The semiconductor device of claim 2 and further comprising a non-porous dielectric layer on said porous dielectric layer.

4. The semiconductor device of claim 2 wherein said height of said air gaps is greater than said height of said metal leads.

5. The semiconductor device of claim 2 wherein said porous dielectric layer comprises a dried gel.

6. A semiconductor device with air gaps between metal leads, comprising:

metal leads formed in a pattern on a substrate, said metal leads having a height above said substrate, said metal leads having sides and tops;

patterned oxide on said tops of said metal leads, said patterned oxide having the same pattern as said metal leads, said patterned oxide having a height of 50–100% said metal lead height;

air gaps fully extending between said sides of said metal leads, said air gaps having a height above said substrate; and a single unpatterned porous dielectric layer residing on said patterned oxide and over said air gaps, said porous dielectric layer having a porosity of 10–50%.

7. The semiconductor device of claim 6 further comprising a non-porous dielectric layer on said porous dielectric layer.

8. The semiconductor device of claim 6 wherein said porous dielectric layer comprises a dried gel.

* * * * *